United States Patent [19]

McEachern et al.

[11] Patent Number: 5,089,979
[45] Date of Patent: Feb. 18, 1992

[54] APPARATUS FOR DIGITAL CALIBRATION OF DETACHABLE TRANSDUCERS

[75] Inventors: Alexander McEachern, Oakland; Frederic W. Nitz, Boulder Creek; Scott C. Terry, Redwood Shores, all of Calif.

[73] Assignee: Basic Measuring Instruments, Foster City, Calif.

[21] Appl. No.: 308,092

[22] Filed: Feb. 8, 1989

[51] Int. Cl.[5] ............................................. G06F 15/20
[52] U.S. Cl. .............................. 364/571.04; 73/1 R; 73/1 B; 364/571.07
[58] Field of Search ................. 364/571.01, 571.02, 364/571.03, 571.04, 571.07, 424.03, 424.04; 73/1 R, 1 B

[56] References Cited

U.S. PATENT DOCUMENTS

| | | | |
|---|---|---|---|
| 4,303,984 | 12/1981 | Hovig | 364/571.07 |
| 4,313,509 | 2/1982 | Engels | 73/1 B |
| 4,418,392 | 11/1983 | Hata | 364/571.07 |
| 4,423,408 | 12/1983 | Place | 324/99 D X |
| 4,592,002 | 5/1986 | Bozarth, Jr. et al. | 364/571.03 |
| 4,611,304 | 9/1986 | Butenko et al. | 364/571.07 |
| 4,845,649 | 7/1989 | Eckhardt et al. | 364/571.02 |
| 4,858,615 | 8/1989 | Meinema | 73/1 R |
| 4,868,476 | 9/1989 | Respaut | 73/633 X |
| 4,873,655 | 10/1989 | Kondraske | 364/571.07 X |

OTHER PUBLICATIONS

Nitz; "Self-Calibration Technique Improves Power Monitor"; *Design News*, pp. 141-146, May 20, 1989.

Primary Examiner—Parshotam S. Lall
Assistant Examiner—Edward R. Cosimano
Attorney, Agent, or Firm—Limbach, Limbach & Sutton

[57] ABSTRACT

The present invention is for digital calibration of plug-in transducers and the like. The invention comprises means for digitally storing error-correcting tables in a physical location which is associated with the transducer, and a means for interpreting those tables.

10 Claims, 4 Drawing Sheets

APPARATUS FOR DIGITAL CALIBRATION OF DETACHABLE TRANSDUCERS

FIELD OF THE INVENTION

This invention relates to the field of measuring instruments with detachable transducers, probes, sensors, and the like. More particularly, this invention relates to the individual digital calibration of such transducers.

BACKGROUND OF THE INVENTION

Measuring apparatuses are known having means for digitally removing errors from a measurement system by converting one or more measurements to a digital value or values and then applying correction algorithms to the digital value or values. These algorithms make use of a table or tables of previously stored digital data which describe the corrections required to make the measurement system more accurate. These tables are stored in the measurement system, and effectively describe the errors of the complete measurement system including a transducer, amplifiers, filters, and analog to digital (A/D) converters.

FIG. 1 shows a typical prior art circuit in which temperature measurements are converted to a voltage 17 by a transducer 16. The voltage 17 is applied to calibrated measuring system 100. After amplification and filtering 10, the internal signal is converted to a digital value by an A/D converter 11. Errors may be introduced by the transducer characteristics, amplifier and filter offset and gain errors, and A/D converter linearity and gain errors.

A microprocessor 13 then looks up this uncorrected digital value 12 in a table of uncorrected values vs. corrected digital value 14. The corrected value can be provided to a user in the display 15. The microprocessor may apply more complicated correction algorithms, such as interpolation and data transformations, to reduce the amount of data stored in the table or to increase the accuracy of the result.

In addition to increasing the accuracy of the measurement system, this prior art digital calibration makes it easier to automate the manufacturing process for the measurement system. Calibration can be performed by a completely automated system which applies a series of known values to the transducer, examines the uncorrected output of the measurement system under calibration, and builds a table of corrections which can then be stored in non-volatile digital memory in the measurement system.

FIG. 2 shows a graphical representation of the table of corrections 14 comparing the uncorrected amplitude 200 to corrected amplitude 201. If the system introduces no errors the uncorrected data 12 will fall on the dotted line 202. Offset errors are shown as the line 203, gain errors as the line 204 and non-linearity errors as the line 205. A more complete discussion of such systems may be found in the background section of our co-pending application entitled METHOD AND APPARATUS FOR CALIBRATING TRANSDUCER/AMPLIFIER SYSTEMS, Ser. No. 308,305 now U.S. Pat. No. 5,014,229.

Because the table of corrections 14 describes the complete system, replacing any element of the system including the transducer requires re-calibrating the measurement system. Certain prior art systems include the transducer 16 in the calibration procedure while others calibrate the remainder of the system 100 ignoring errors introduced by the transducer 16. This may be impractical, especially if many plug-in transducers are desirable. Such a system may be desirable, for example, in a temperature sensing system having several probes, each of which is sensitive over different ranges of temperatures.

Some prior art systems ignore the errors of plug-in transducers and only calibrate the remaining parts of the measurement system; this approach can leave in place substantial transducer errors. Other prior art systems use analog calibration of plug-in transducers; this approach makes it more difficult to automate the production of the entire measurement system.

SUMMARY OF THE INVENTION

This invention is for an apparatus to calibrate detachable transducers. The apparatus includes a control system having a processor and a processor memory. The processor memory includes a first table of corrections for correcting errors introduced by the control system. The apparatus also includes a detachable plug-in transducer module. The module has a transducer and a module memory. The module memory includes a second table of corrections for correcting errors introduced by the transducer. The module memory is preferably non-volatile memory.

DETAILED DESCRIPTION OF THE PREFERRED EMBODIMENT

Figure 1:
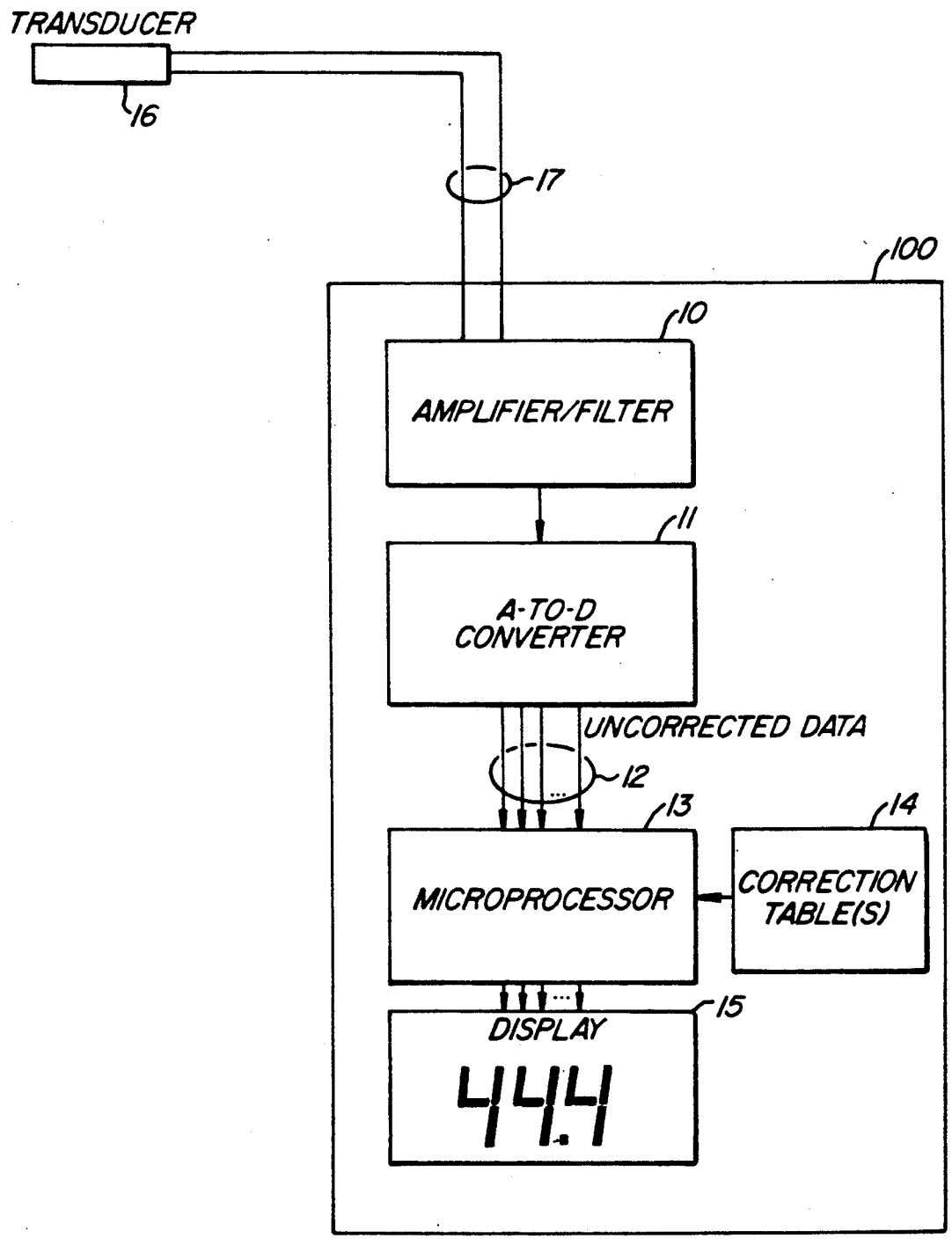
FIG. 1 shows a block diagram of a typical prior art digital calibration system.
Figure 2:
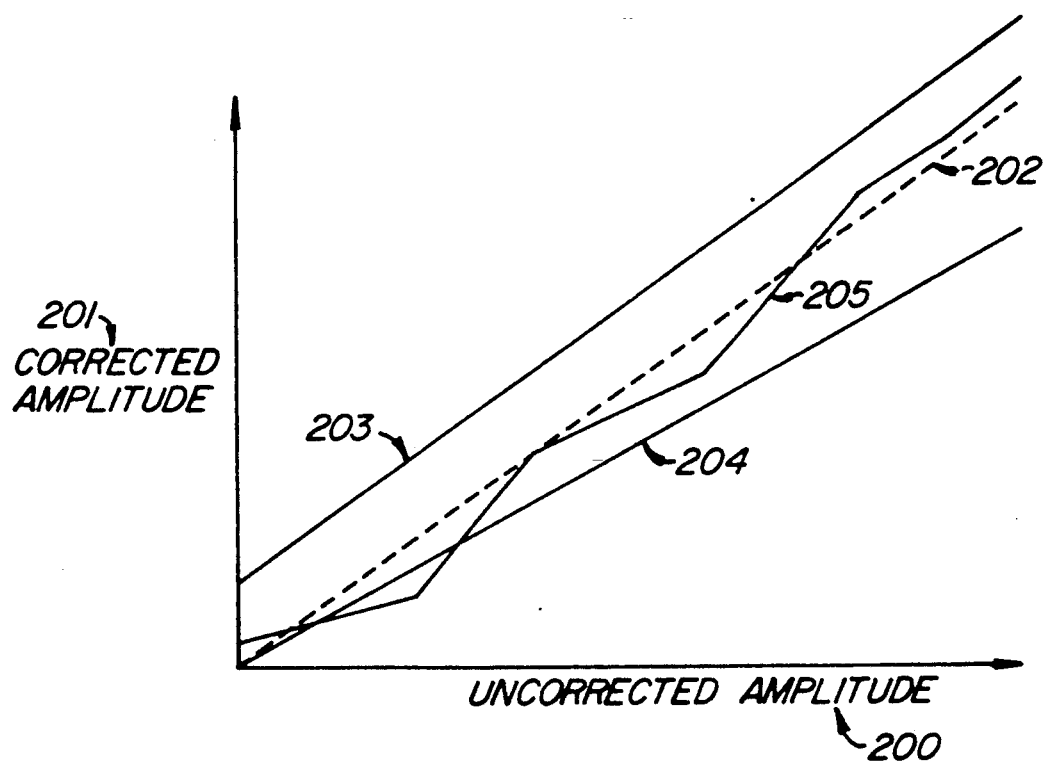
FIG. 2 shows a graphical representation of a typical prior art digital calibration table.
Figure 3:
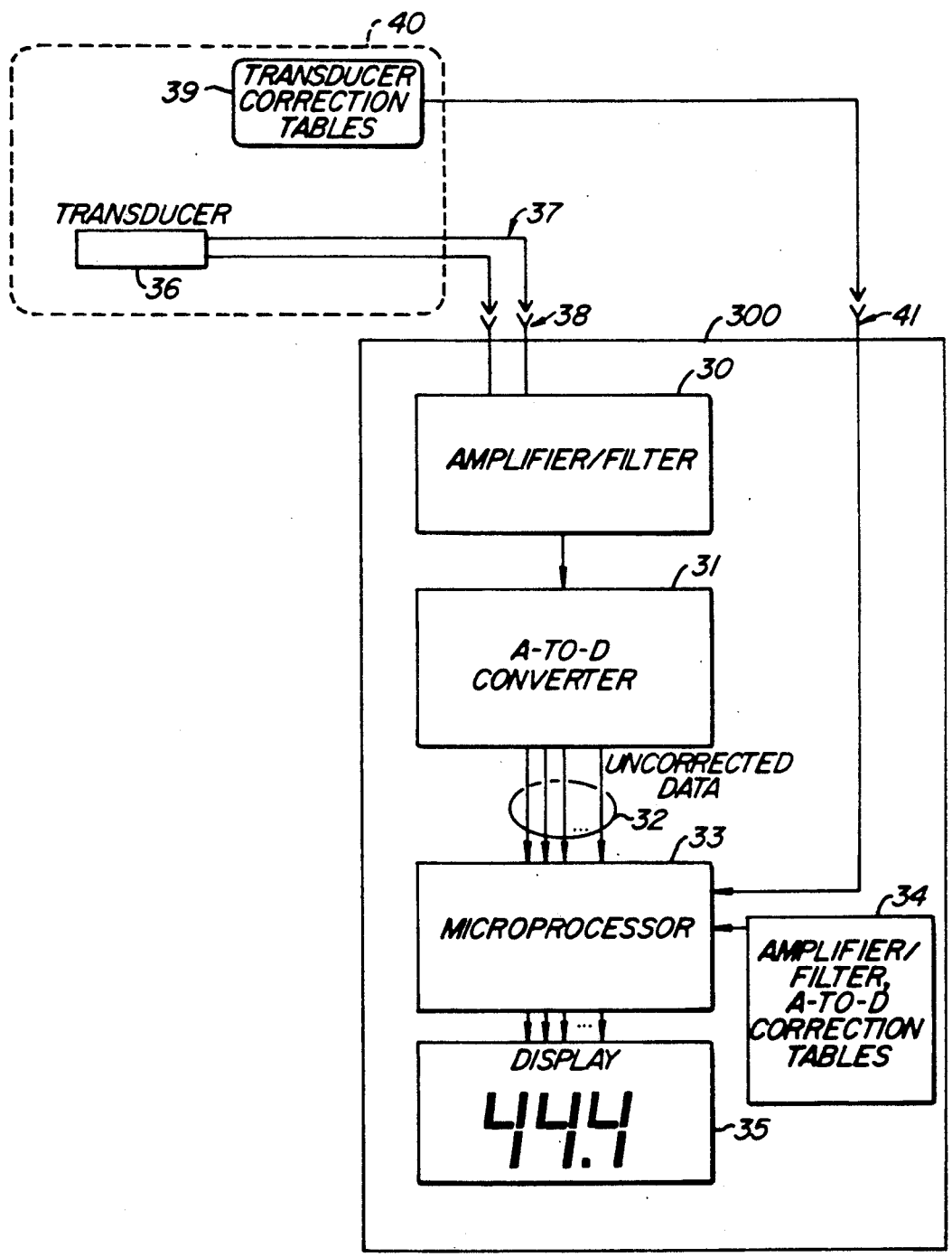
FIG. 3 shows the preferred embodiment of the present invention where digital calibration data is stored both in the transducer and in the measurement system.

The invention includes a plug-in transducer module 40 which includes means for storing transducer correction tables in a non-volatile digital memory 39 which is physically associated with a transducer 36. The transducer module 40 is plugged into a correction system 300. The transducer 36 may be a temperature transducer, a humidity transducer, a current transducer, a strain transducer, microphone, or any other type of transducer for which the first-order errors are either repeatable or predictable over time. The non-volatile digital memory 39 may be EAROM, EPROM, or any other means which is well known in the art. The analog output 37 of the transducer is electrically connected to the measurement system with a detachable connection 38. The transducer correction tables 39 are accessible to the microprocessor through a similar detachable connection 41, which may consist of additional pins on the same connector. The analog output 37 of the transducer is applied to the amplifier/filter 30. Its output is applied to the input of an analog to digital converter 31, which in turn provides uncorrected digital data 32 to a microprocessor 33. The microprocessor may be replaced by appropriate random logic such as an ASIC, PLA or PAL. The microprocessor 33 first applies the internally stored correction table for the amplifier, filter, and A/D errors 34. The digital result is an accurate measurement of the analog input at the connector 38. The digital result can be shown to the user in a display 35. The microprocessor then applies the transducer correction table stored with the transducer 39 to this digital result, yielding the final correct digital measurement. The microprocessor can then display or otherwise make use of this measurement.

Each transducer 36 can be individually calibrated by an automated system which applies a set of known signals to the transducer 36, measures the transducer's analog output 37, builds a correction table for this transducer, and stores the correction table in the digital nonvolatile memory 39 associated with that transducer.

The accuracy of certain types of transducers may vary as a function of external physical parameters. For example, errors may be introduced, in part, to a current sensing transducer by the temperature at which the transducer operates or errors may be introduced, in part, to a microphone transducer by the ambient humidity. Utilizing the preferred embodiment of the present invention to calibrate transducers which are sensitive to such physical parameters will produce accurate results only when operating under conditions similar to those at which the calibration took place.

Figure 4:
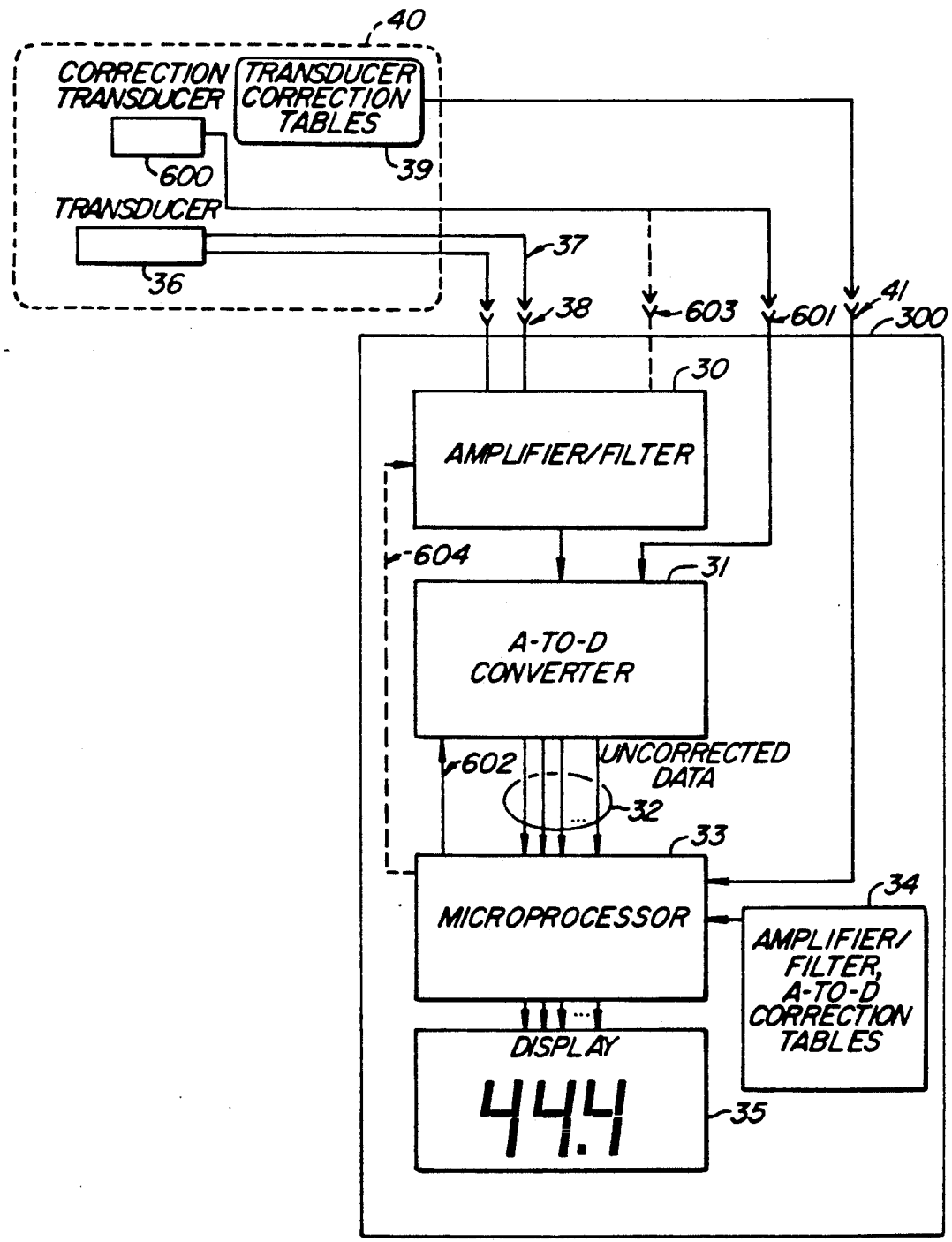
FIG. 4 shows an alternate embodiment of the present invention. Like numerals will be used for the same elements found in FIG. 3.

FIG. 4 shows a block diagram of an alternate embodiment of the present invention. A correction transducer 600 is included in the transducer module 40. The correction transducer 600 is chosen to sense that parameter to which the primary transducer 36 is most sensitive, e.g. humidity for a microphone transducer.

The transducer correction tables 39 are expanded to include information related to the correction transducer 600. For example, if the humidity were expected to vary over the range 30% to 95% relative humidity for a given microphone, the transducer correction tables 39 may include a complete set of correction tables to correct known errors for the transducer 36 for every change of 5% humidity in that range of humidity.

The value measured by the correction transducer 600 is applied to the A/D converter 31 through connector 601 The microprocessor 33 controls the A/D converter 31 through control line 602 to read the signal from the transducer 36 or from the correction transducer 600 as appropriate. In this manner, the microprocessor 33 reads the value of the physical parameter measured by the correction transducer 600 to determine which of the sets of transducer correction tables 39 to apply. The microprocessor then reads the value measured by the transducer 36 and corrects any errors introduced by that device.

If the signal produced by the correction transducer 600 is too small to be accurately read by the A/D converter 31 alone that signal is applied to the amplifier/filter 30 through connector 603. In this case, the microprocessor 33 controls the amplifier/filter 30 through control line 604 to read the signal from the transducer 36 or the correction transducer 600.

What is claimed is:

1. A measuring system for measuring a parameter comprising:
   a) a plurality of interchangeable probes for measuring a parameter wherein each probe includes:
      1) a transducer integral to the probe for measuring the parameter and providing a signal representative of the parameter; and
      2) a first digital memory integral to the probe for storing a table of probe correction data; and
   b) a plurality of base units wherein any one of the interchangeable probes can be coupled to any one of the base units for providing the signal and the data to that base unit, wherein each base unit includes analog electronic circuits coupled to receive the signal from the probe and which includes:
      1) an analog to digital converter;
      2) a second digital memory integral to the base unit for storing a table of base unit correction data; and
      3) digital electronic circuits coupled to the first digital memory and second digital memory for accessing the data stored in the first memory and the second memory and for making a correction for any errors introduced by the probe and the base unit, respectively.

2. The system according to claim 1 wherein the first digital memory and the second digital memory are nonvolatile memory circuits.

3. The system according to claim 1 wherein the parameter is electric current.

4. The system according to claim 1 wherein the analog electronic circuits includes an amplifier coupled to receive the signal for forming an amplified signal, a filter coupled to receive the amplified signal for forming a filtered signal and coupled to provide the filtered signal to the analog to digital converter.

5. The system according to claim 1 wherein the digital electronic circuits include a microprocessor.

6. The system according to claim 1 wherein the digital electronic circuits include a PLA.

7. The system according to claim 1 wherein the digital electronic circuits include a PAL.

8. A measuring system for measuring a parameter comprising:
   a) a plurality of base unit instrument wherein each base unit comprises:
      i) an amplifier for forming an amplified analog signal;
      ii) a filter coupled to the amplifier to receive the amplified analog signal for forming a filtered signal;
      iii) an analog to digital converter coupled to the filter to receive the filtered signal for forming a digital signal;
      iv) a digital circuit coupled to the converter to receive the digital signal; and
      v) a first digital memory coupled to the digital circuit for storing base unit correction tables for correcting repeatable errors introduced by the base unit; and
   b) a plurality of interchangeable probes for sensing the parameter wherein each one of the probes comprises:
      i) a connector for coupling that probe to any one of the base units;
      ii) a transducer mounted in the probe and electrically coupled to the amplifier through the connector for sensing the parameter and for providing an analog signal to the amplifier which is representative of the parameter; and
      ii) a second digital memory of probe correction tables mounted in the probe and electrically coupled to the digital circuit for correcting repeatable errors introduced by the probe,
   wherein any probe may be coupled to any base unit so that errors introduced by the base unit and the probe are corrected by the digital circuit using the base unit correction tables stored in the first memory and the probe correction tables stored in the second memory.

9. The system according to claim 8 wherein the first digital memory and the second digital memory are nonvolatile memory circuits.

10. The system according to claim 8 wherein the parameter is electric current.

* * * * *